US008244197B2

(12) United States Patent
Fujii et al.

(10) Patent No.: US 8,244,197 B2
(45) Date of Patent: Aug. 14, 2012

(54) RECEIVING DEVICE AND ELECTRONIC EQUIPMENT USING THE SAME

(75) Inventors: Takeshi Fujii, Osaka (JP); Hiroaki Ozeki, Osaka (JP); Mineyuki Iwaida, Kyoto (JP)

(73) Assignee: Panasonic Corporation, Osaka (JP)

( * ) Notice: Subject to any disclaimer, the term of this patent is extended or adjusted under 35 U.S.C. 154(b) by 643 days.

(21) Appl. No.: 12/304,084

(22) PCT Filed: Mar. 27, 2008

(86) PCT No.: PCT/JP2008/000750
§ 371 (c)(1),
(2), (4) Date: Dec. 9, 2008

(87) PCT Pub. No.: WO2008/126360
PCT Pub. Date: Oct. 23, 2008

(65) Prior Publication Data
US 2010/0178890 A1 Jul. 15, 2010

(30) Foreign Application Priority Data

Mar. 29, 2007 (JP) .................................. 2007-087431

(51) Int. Cl.
*H04B 1/10* (2006.01)
(52) U.S. Cl. ......... 455/302; 455/307; 327/552; 327/553
(58) Field of Classification Search ........................ None
See application file for complete search history.

(56) References Cited

U.S. PATENT DOCUMENTS

| 4,123,712 A | * | 10/1978 | Mikhael ........................ 455/109 |
| 6,226,509 B1 | * | 5/2001 | Mole et al. ..................... 455/302 |
| 6,278,870 B1 | * | 8/2001 | Davie et al. ................... 455/302 |
| 6,388,543 B1 | * | 5/2002 | Molnar et al. ................. 333/172 |

(Continued)

FOREIGN PATENT DOCUMENTS

JP     2002-217682     8/2002

(Continued)

OTHER PUBLICATIONS

Japanese Office Action for JP2008-535821 dated Jan. 18, 2011.

(Continued)

*Primary Examiner* — Tuan T Lam
(74) *Attorney, Agent, or Firm* — Pearne & Gordon LLP (57) ABSTRACT

In an image rejection mixer, when a signal in the first radio frequency band is inputted to an input terminal, the first mixer and the second mixer convert the input signal in the first radio frequency band to a signal in the first intermediate frequency band by using the first local signal from a local signal oscillator, and a filter circuit attenuates an image interfering signal existing in the first intermediate frequency band by means of the first attenuation band. Also, when a signal in the second radio frequency band is inputted to the input terminal, the first mixer and the second mixer convert the input signal in the second radio frequency band to a signal in the second intermediate frequency band by using the second local signal from the local signal oscillator, and the filter circuit attenuates an image interfering signal existing in the second intermediate frequency band by means of the second attenuation band that is narrower than the first attenuation band.

13 Claims, 6 Drawing Sheets

U.S. PATENT DOCUMENTS

| | | | |
|---|---|---|---|
| 6,993,310 B2 * | 1/2006 | Magnusen et al. | 455/302 |
| 7,045,636 B2 * | 5/2006 | Palani et al. | 548/400 |
| 7,424,281 B1 * | 9/2008 | Duggan | 455/302 |
| 7,860,478 B2 * | 12/2010 | Lim et al. | 455/307 |
| 2006/0128341 A1 * | 6/2006 | Magnusen et al. | 455/307 |
| 2008/0132189 A1 * | 6/2008 | Maxim et al. | 455/280 |
| 2011/0092169 A1 * | 4/2011 | Savoj | 455/73 |

FOREIGN PATENT DOCUMENTS

| | | |
|---|---|---|
| JP | 2003-298356 | 10/2003 |
| JP | 2006-319398 | 11/2006 |

OTHER PUBLICATIONS

International Search Report.

* cited by examiner

RECEIVING DEVICE AND ELECTRONIC EQUIPMENT USING THE SAME

TECHNICAL FIELD

The present invention relates to a receiving device mounted with an image rejection mixer for attenuating image interfering signals, and an electronic equipment using the same.

BACKGROUND ART

In communication equipment or AV equipment, an image rejection mixer for attenuating image interfering signals at a frequency symmetrical to a desired frequency, mainly a local signal frequency, has been conventionally employed. Shown in FIG. 6 is an example of conventional receiving device mounted with an image rejection mixer disclosed in Patent document 1.

Figure 6:
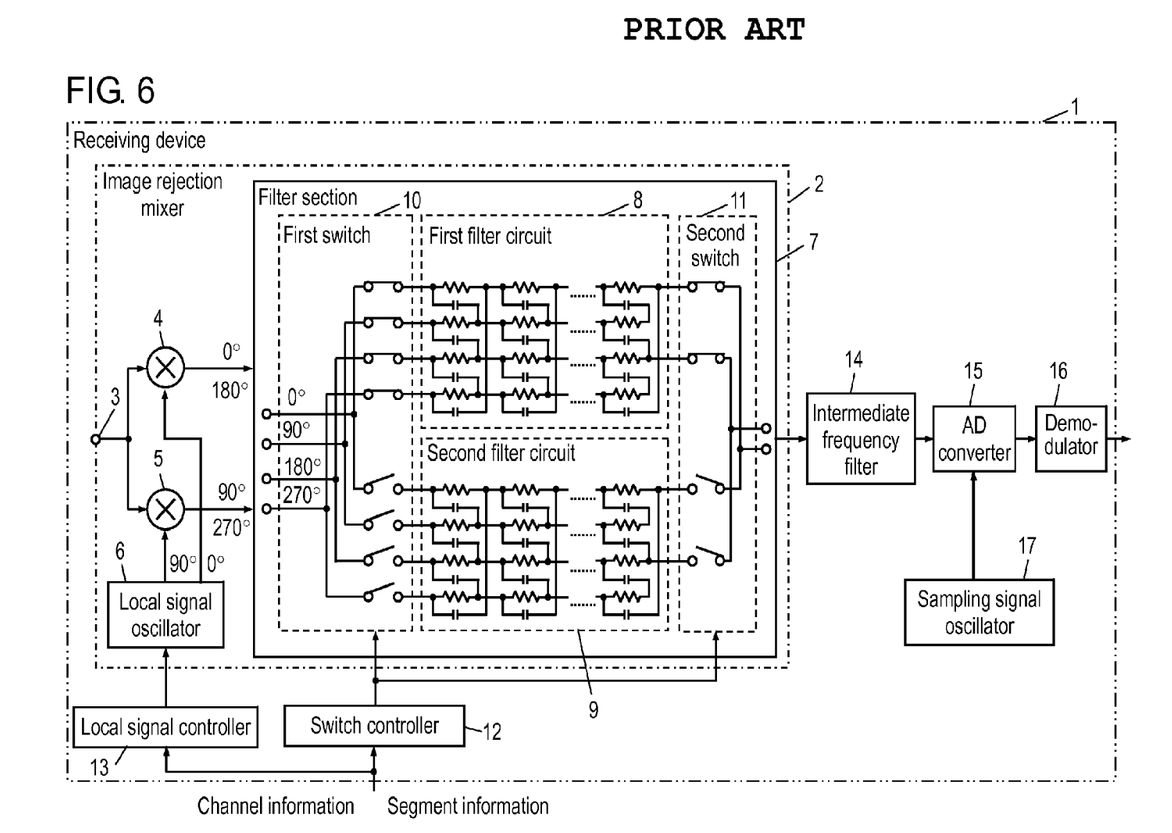
FIG. 6 is a block diagram of a conventional receiving device.

In FIG. 6, image rejection mixer 2 in conventional receiving device 1 has input terminal 3 to which a signal in the first radio frequency band or a signal in the second radio frequency band narrower than the first radio frequency band is inputted. Also, it comprises first mixer 4 and second mixer 5 directly or indirectly connected to input terminal 3. Further, it includes local signal oscillator 6 for oscillating local signals having phase difference which are applied to these first mixer 4 and second mixer 5. Also, it has filter section 7 for combining a signal from first mixer 4 with a signal from second mixer 5 by rotating at least one of the phase of signal from first mixer 4 and the phase of signal from second mixer 5.

Filter section 7 includes first filter circuit 8 for the first intermediate frequency band which is formed of a polyphase filter, and second filter circuit 9 for the second intermediate frequency band which is formed of a polyphase filter. Also, it comprises first switch 10 for switching and inputting a signal to first filter circuit 8 or second filter circuit 9. Further, it has second switch 11 for switching and outputting a signal from first filter circuit 8 or second filter circuit 9.

Also, receiving device 1 comprises image rejection mixer 2, and intermediate frequency filter 14 for attenuating unnecessary signals that cannot be attenuated by image rejection mixer 2. Further, it includes AD converter 15 connected to the output side of intermediate frequency filter 14, and demodulator 16 connected to the output side of AD converter 15. Also, it has sampling signal oscillator 17 which is connected to the other input terminal of AD converter 15 and produces a sampling signal.

Further, receiving device 1 includes switch controller 12 which obtains channel information and segment information from a channel setter (not shown) in order to control first switch 10 and second switch 11 in accordance with the information. Also, it includes local signal controller 13 which obtains channel information and segment information from a channel setter in order to control the local signal frequency of local signal oscillator 6 in accordance with the information.

In the case of such a conventional receiving device, when a signal in the first radio frequency band or the second radio frequency band is inputted to input terminal 3, switch controller 12 changes over first switch 10 and second switch 11 in accordance with channel information and segment information. And, when a signal in the first radio frequency band is inputted, first filter circuit 8 is selected by first switch 10 and second switch 11. In this way, first filter circuit 8 attenuates image interfering signal existing in the first intermediate frequency band by means of the first attenuation band. Also, when a signal in the second radio frequency band is inputted, second filter circuit 9 is selected by first switch 10 and second switch 11. In this way, second filter circuit 9 attenuates image interfering signal existing in the second intermediate frequency band by means of the second attenuation band.

As described above, for receiving a plurality of desired waves different in bandwidth for example switching and receiving 1-segment broadcast and 3-segment broadcast of ground wave digital broadcast, it is necessary to have first filter circuit 8 and second filter circuit 9 formed of a polyphase filter for each bandwidth. Further, it is necessary to have first switch 10 and second switch 11 for switching first filter circuit 8 and second filter circuit 9. Accordingly, there arises a problem that such a conventional receiving device becomes larger in size.

The present invention is intended to solve the above problem and provide a receiving device which can be reduced in size.

Patent document 1: Unexamined Japanese Patent Publication 2003-298356.

DISCLOSURE OF THE INVENTION

A receiving device of the present invention has an image rejection mixer which comprises an input terminal to which a signal in the first radio frequency band or signal in the second radio frequency band narrower than the first radio frequency band is inputted, a first mixer and a second mixer connected in parallel fashion to the input terminal, a local signal oscillator for oscillating local signals having a phase difference from each other and being applied to the first mixer and the second mixer, and a filter circuit for combining a signal from the first mixer with a signal from the second mixer by rotating at least one of a phase of the signal from the first mixer and a phase of the signal from the second mixer, wherein when a signal in the first radio frequency band is inputted to the input terminal, the first mixer and the second mixer convert the input signal in the first radio frequency band to a signal in the first intermediate frequency band by using a first local signal from the local signal oscillator, while the filter circuit attenuates an image interfering signal existing in the first intermediate frequency band by means of the first attenuation band, and also, when a signal in the second radio frequency band in inputted to the input terminal, the first mixer and the second mixer convert the input signal in the second radio frequency band to a signal in the second intermediate frequency band by using a second local signal from the local signal oscillator, and the filter circuit attenuates an image interfering signal existing in the second intermediate frequency band by means of the second attenuation band narrower than the first attenuation band.

In the above configuration, the image rejection mixer using a single filter circuit is able to attenuate an image interfering signal in the first intermediate frequency band and an image interfering signal in the second intermediate frequency band different in bandwidth. Consequently, it is possible to reduce the size of the receiving device. Further, when a signal in the second radio frequency band is inputted, the filter circuit attenuates the input signal by means of the second attenuation band being narrower in bandwidth, and thereby, it is possible to enhance the attenuation in the second attenuation band. As a result, it is possible to improve the reception quality of the receiving device in the case of input signal in the second radio frequency band.

| Description of the Reference Numerals and Signs | |
|---|---|
| 14 | Receiving device |
| 15 | Image rejection mixer |
| 16 | Input terminal |
| 17 | First mixer |
| 18 | Second mixer |
| 19 | Local signal oscillator |
| 20 | Filter circuit |
| 21 | Intermediate frequency filter |
| 22 | AD converter |
| 23 | Demodulator |
| 24 | Sampling signal oscillator |
| 25 | Local signal control unit |
| 26 | Sampling signal control unit |
| 27 | Switch controller |

DETAILED DESCRIPTION OF THE PREFERRED EMBODIMENTS

A receiving device in the preferred embodiment of the present invention will be described in the following with reference to the drawings.

Preferred Embodiment

Figure 1:
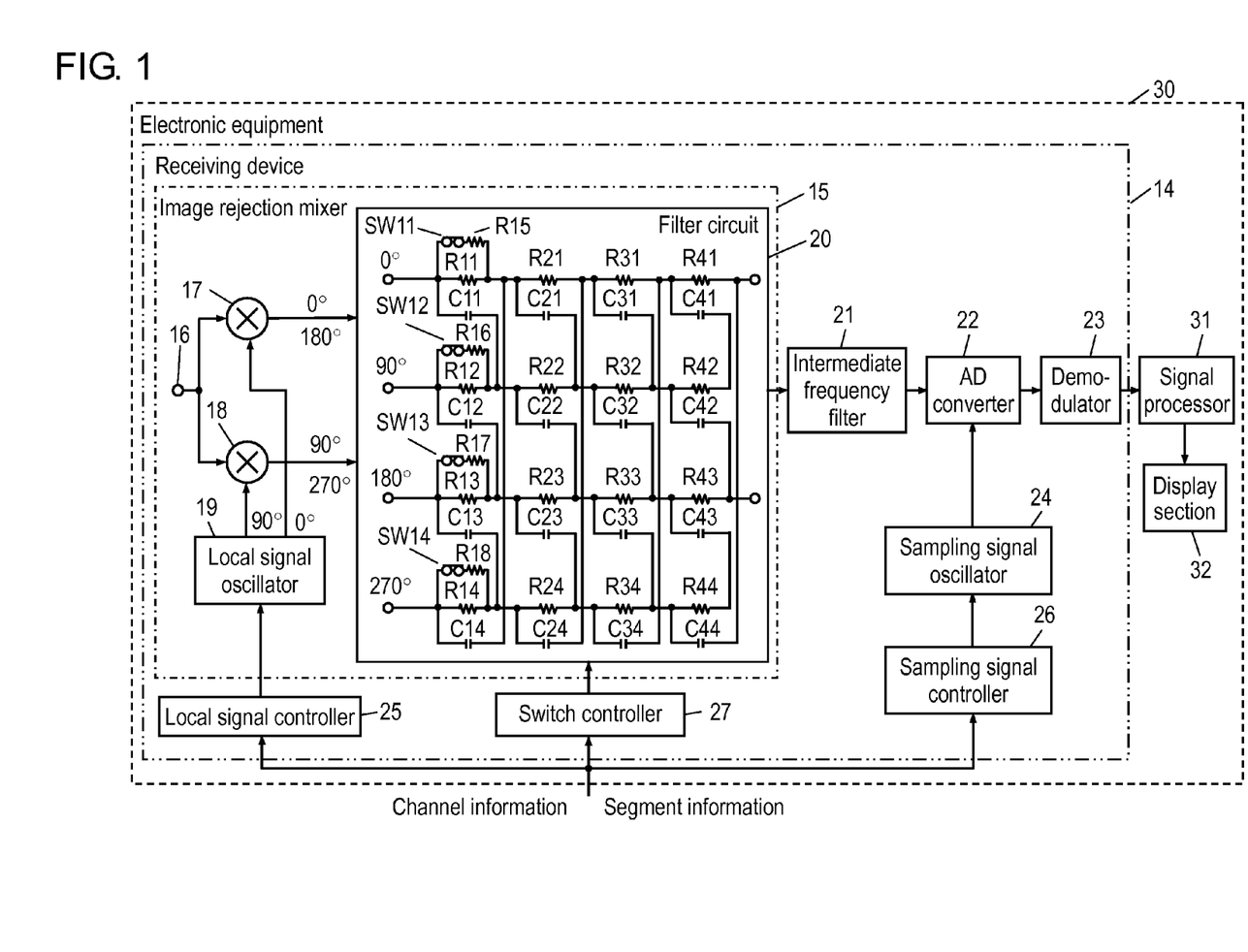
FIG. 1 is a block diagram of electronic equipment having a receiving device in one preferred embodiment of the present invention.

FIG. 1 is a block diagram of electronic equipment having a receiving device in the preferred embodiment 1 of the present invention. In FIG. 1, image rejection mixer 15 in receiving device 14 of the present invention has input terminal 16 to which a signal in the first radio frequency band or a signal in the second radio frequency band narrower than the first radio frequency band is inputted. Further, it includes first mixer 17 and second mixer 18 connected in parallel fashion directly or indirectly to input terminal 16. Also, it includes local signal oscillator 19 for oscillating local signals having phase difference which are applied to first mixer 17 and second mixer 18. The phases of local signals inputted to first mixer 17 and second mixer 18 are nearly orthogonal to each other. Further, image rejection mixer 15 comprises filter circuit 20 formed of a polyphase filter for combining the signal from first mixer 17 with the signal from second mixer 18 by rotating at least one of the phase of signal from first mixer 17 and the phase of signal from second mixer 18.

Filter circuit 20 is for example a polyphase filter with 4 sets of RC phase shifters connected in series fashion. That is, filter circuit 20 comprises the first RC phase shifter, second RC phase shifter, third RC phase shifter, and fourth RC phase shifter connected in order from the input side.

The first RC phase shifter includes resistor R11 to which a signal of phase shift angle 0 deg. is inputted from first mixer 17 and resistor R12 to which a signal of phase shift angle 90 deg. is inputted from second mixer 18. Further, it includes resistor R13 to which a signal of phase shift angle 180 deg. is inputted from first mixer 17 and resistor R14 to which a signal of phase shift angle 270 degree is inputted from second mixer 18. It also includes resistors R15~R18 respectively connected in parallel fashion to resistors R11~R14, and switches SW11~SW14 for switching ON-OFF connections of resistors R15~R18. Further, it comprises capacitor C11 connected between the input of resistor R11 and the output of resistor R12, and capacitor C12 connected between the input of resistor R12 and the output of resistor R13. Also, it includes capacitor C13 connected between the input of resistor R13 and the output of resistor R14, and C14 connected between the input of resistor R14 and the output of resistor R11.

Also, the second RC phase shifter includes resistors R21~R24. It also includes capacitor C21 connected between the input of resistor R21 and the output of resistor R22, and capacitor C22 connected between the input of resistor R22 and the output of resistor R23. Further, it comprises capacitor C23 connected between the input of resistor R23 and the output of resistor R24, and C24 connected between the input of resistor R24 and the output of resistor R21. Also, the third RC phase shifter the same as in the second RC phase shifter comprises resistors R31~R34 and capacitors C31~C34. Further, the fourth RC phase shifter the same as in the second RC phase shifter comprises resistors R41~R44 and capacitors C41~C44.

Further, receiving device 14 includes image rejection mixer 15, and intermediate frequency filter 21 for attenuating unnecessary signals that cannot be attenuated by image rejection mixer 15. Further, it comprises AD converter 22 connected to the output side of intermediate frequency filter 21, and demodulator 23 connected to the output side of AD converter 22. It also includes sampling signal oscillator 24 which is connected to the other input terminal of AD converter 22 and produces sampling signals.

Further, receiving device 14 includes local signal controller 25 which obtains channel information and segment information from a channel setter (not shown) in order to control the frequency of local signal of local signal oscillator 19 in accordance with the information. Also, it has sampling signal controller 26 which obtain channel information and segment information from the channel setter for the purpose of controlling the sampling frequency of sampling signal oscillator 24 in accordance with the information. Further, it includes switch controller 27 which obtains channel information and segment information from the channel setter in order to control switches SW11~SW14 in accordance with the information.

Electronic equipment 30 mounted with receiving device 14 includes signal processor 31 connected to the output side of demodulator 23 and display section 32 connected to the output side of the signal processor.

The operation of image rejection mixer 15 will be described in the following. When a signal in the first radio frequency band is inputted to input terminal 16, first mixer 17 and second mixer 18 serve to convert the input signal in the first radio frequency band to a signal in the first intermediate frequency band by using the first local signal from local signal oscillator 19. Further, filter circuit 20 attenuates the image interfering signal existing in the first intermediate frequency band by means of the first attenuation band.

Specifically, switch controller 27 turns ON switches SW11~SW14 of filter circuit 20 in accordance with channel information and segment information from a channel setter (not shown). In this way, resistors R15~R18 are connected to resistors R11~R14 in parallel fashion.

Accordingly, frequencies f1~f4 at which the phase rotation becomes 90-degree with respect to the first RC phase shifter to the fourth RC phase shifter of the polyphase filter are as follows:

$f1=1/(2\pi \times (R11//R15) \times C11)$ $f2=1/(2\pi \times R21 \times C21)$ $f3=1/(2\pi \times R31 \times C31)$ $f4=1/(2\pi \times R41 \times C41)$, where $R11//R15=R12//R16=R13//R17=R14//R18$ $R11//R15=R11 \times R15/(R11+R15)$ $R12//R16=R12 \times R16/(R12+R16)$ $R13//R17=R13 \times R17/(R13+R17)$ $R14//R18=R14 \times R18/(R14+R18)$ $R21=R22=R23=R24$ $R31=R32=R33=R34$ $R41=R42=R43=R44$ $C41=C42=C43=C44$.

Also, when a signal in the second radio frequency band is inputted to input terminal 16, first mixer 17 and second mixer 18 convert the input signal in the second radio frequency band to a signal in the second intermediate frequency band by using the second local signal from local signal oscillator 19. Further, filter circuit 20 attenuates the image interfering signal existing in the second intermediate frequency band by means of the second attenuation band narrow than the first attenuation band.

Specifically, switch controller 27 turns OFF switches SW11~SW14 of filter circuit 20 in accordance with channel information and segment information from a channel setter (not shown). Thus, resistors R15~R18 are not connected in parallel fashion to resistors R11~R14.

Accordingly, frequency f1' at which the phase rotation becomes 90° with respect to the first RC phase shifter of the polyphase filter is as follows:

$f1'=1/[2\pi \times R11 \times C11]$

Also, the frequencies at which the phase rotation becomes 90° with respect to the second RC phase shifter to the fourth RC phase shifter are f2~f4 mentioned above.

Figure 2:
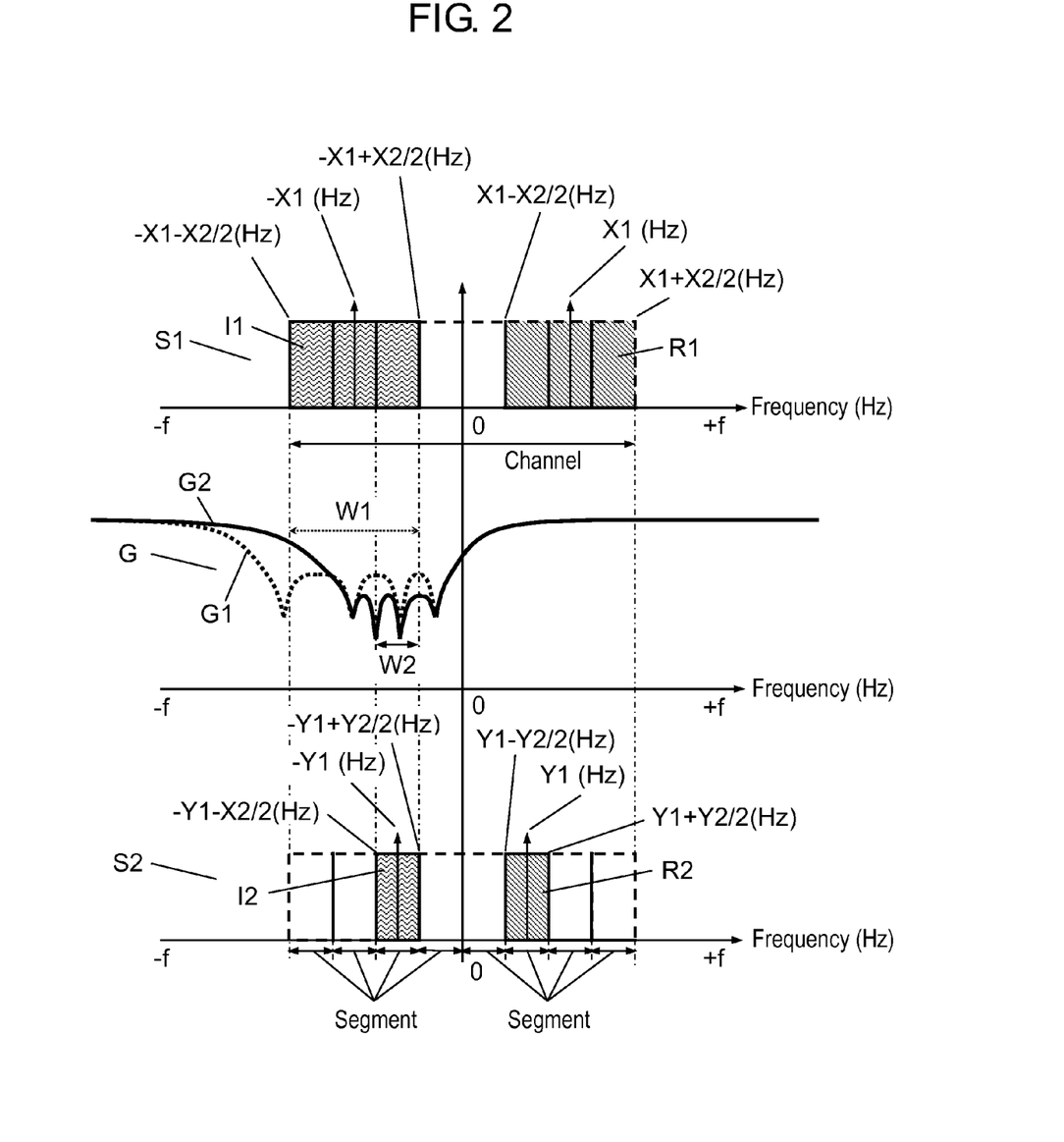
FIG. 2 is a diagram showing the relationship between gain characteristics of a filter circuit and spectrums of the first and second intermediate frequency bands in the preferred embodiment.

The frequency characteristic of gain of filter circuit 20 in operation of image rejection mixer 15 is described in detail by using FIG. 2. In FIG. 2, gain characteristic G of filter circuit 20 is compared with spectrum S1 of the first intermediate frequency band and spectrum S2 of the second intermediate frequency band.

Figure 3:
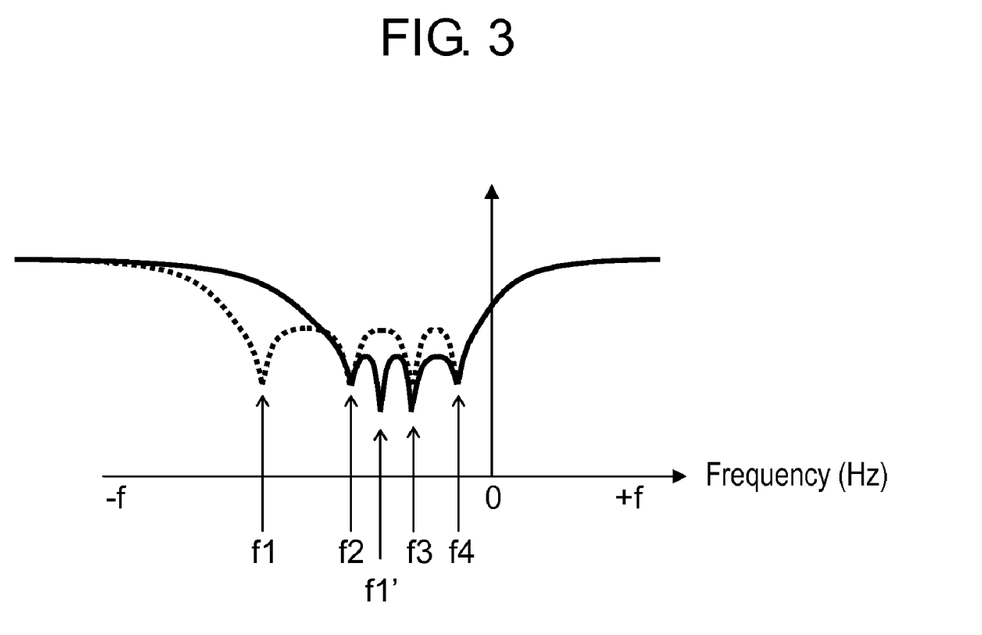
FIG. 3 is a chart of gain characteristics of a filter circuit in the preferred embodiment.

In gain characteristic G of filter circuit 20 that is shown in the middle portion of FIG. 2, the vertical axis and horizontal axis respectively stand for gain and frequency. On the horizontal axis, the right side of 0 Hz is positive frequency, and the left side thereof is negative frequency. Broken line G1 of gain characteristic G shows the first attenuation band (attenuation bandwidth W1 [Hz]), and solid line G2 of the gain characteristic shows the second attenuation band (attenuation bandwidth W2 [Hz]). The relationship between frequencies f1~f4 and f1' at which the phase rotation of the first RC phase shifter to the fourth RC phase shifter of the polyphase filter becomes 90° is shown in FIG. 3. Spectrum S1 shown in the upper portion of FIG. 2 shows the spectrum of the first intermediate frequency band. When the central frequency of desired signal R1 is X1 [Hz], and the bandwidth is X2 [Hz], then the upper end of desired signal R1 is (X1+X2/2) [Hz], and the lower end is (X1−X2/2) [Hz]. Accordingly, the central frequency of image interfering signal I1 is (−X1) [Hz], the upper end is (−X1+X2/2) [Hz], and the lower end is (−X1−X2/2) [Hz].

The lower portion of FIG. 2 shows spectrum S2 of the second intermediate frequency band narrower than the first intermediate frequency band. When the central frequency of desired signal R2 is Y1 [Hz], and the bandwidth is Y2 [Hz], then the upper end of desired signal R2 is (Y1+Y2/2) [Hz], and the lower end thereof is (Y1−Y2/2) [Hz]. Accordingly, the central frequency of image interfering signal I2 is (−Y1) [Hz], the upper end is (−Y1+Y2/2) [Hz], and the lower end is (−Y1−Y2/2) [Hz]. As shown in Fig. FIG. 2, when the frequency relation of the first intermediate frequency band and the second intermediate frequency band is $(-X1-X2/2) \leq (-Y1-Y2/2) < (-Y1+Y2/2) \leq (-X1+X2/2)$, then the gain characteristic of filter circuit 20 is the first attenuation bandwidth W1>the second attenuation bandwidth W2.

In the above configuration, image rejection mixer 15 using single filter circuit 20 is able to attenuate image interfering signal I1 in the first intermediate frequency band and image interfering signal I2 in the second intermediate frequency band different in bandwidth. As a result, unlike the conventional example, two switches and two filter circuits are not needed, and it is possible to reduce the size of receiving device 14.

Further, when a signal in the second radio frequency band is inputted, filter circuit 20 attenuates the input signal by means of the second attenuation band narrower than the first attenuation band. In this way, the respective attenuation poles of the first RC phase shifter to the fourth RC phase shifter can be concentrated in the narrower frequency band, and therefore, the attenuation in the second attenuation band can be enhanced more than that in the first attenuation band. As a result, when a signal in the second radio frequency band is inputted, filter circuit 20 is able to greatly suppress an image interfering signal, and it is possible to improve the reception quality of receiving device 14.

Generally, when a mobile receiver such as a portable telephone or car-mounted equipment receives a ground wave digital broadcast, multipath is liable to be superposed on the radio signal received from the broadcasting base station. Accordingly, the narrower the signal bandwidth received (receiving segments become decreased from 13 segments-->3 segments-->1 segment), the improvement of receiving quality more depends upon the enhancement of image suppressing characteristic. That is, since the receiving device in the present preferred embodiment is improved in image suppressing characteristic as compared with the conventional one, it is suitable as such a mobile receiver for equipment that receives ground wave digital broadcasts and may bring about excellent effects.

In the configuration shown in FIG. 1, filter circuit 20 is configured in that only the RC product (the RC product is the product of the circuit resistance and the circuit capacitance, and the value of RC product means the value of the time constant.) of the first RC phase shifter is changed over, but it is also preferable to be configured in that the RC products of two sets of the first RC phase shifter and the second RC phase shifter are changed over.

Figure 4:
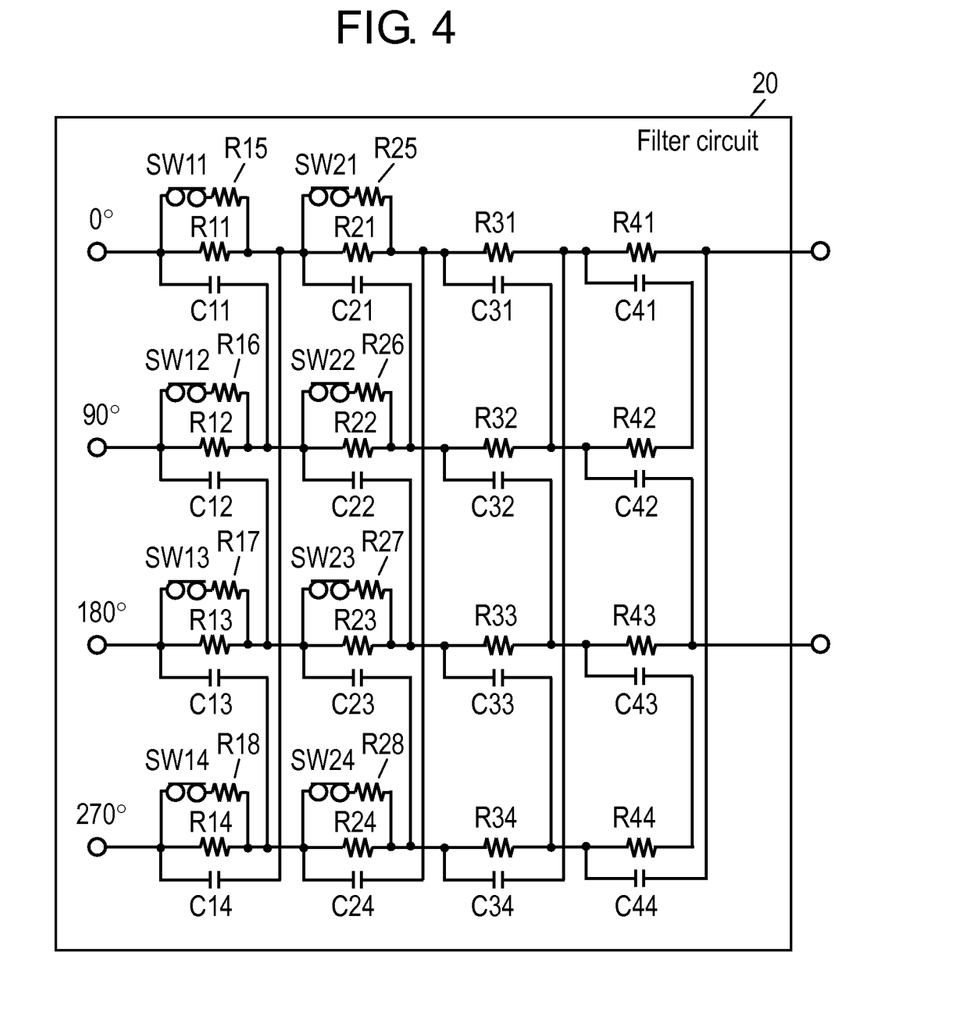
FIG. 4 is a configuration diagram of another filter circuit in the preferred embodiment.
Figure 5:
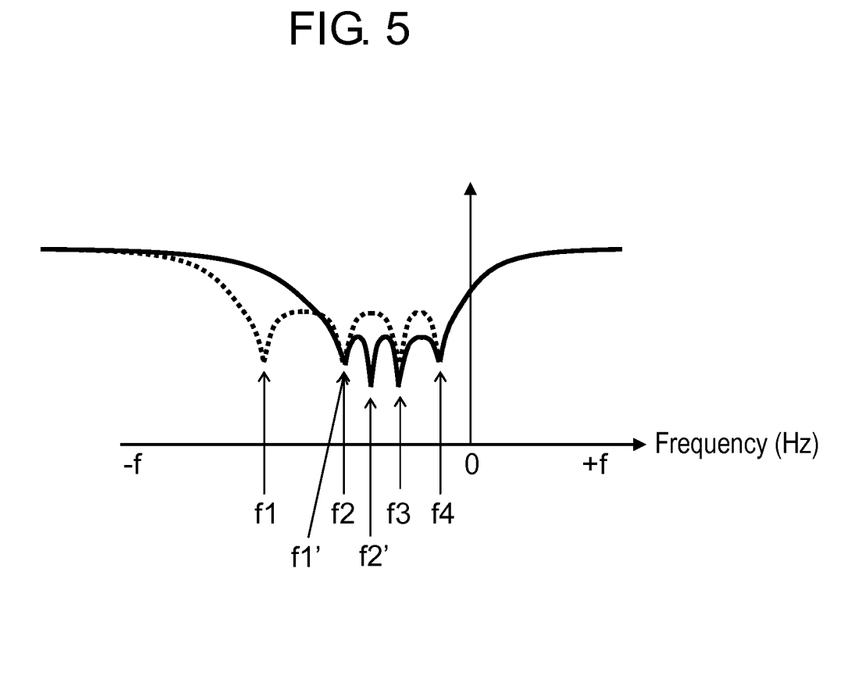
FIG. 5 is a chart of gain characteristics of a filter circuit shown in FIG. 4.

In FIG. 4, the second RC phase shifter includes, same as in the first RC phase shifter, resistors R21~R24, and resistors R25~R28 respectively connected in parallel fashion to resistors R21~R24. Further, it includes switches SW21~SW24 for switching ON-OFF connections of resistors R21~R24. Also, it includes capacitor C21 connected between the input of resistor R21 and the output of resistor R22, and capacitor C22 connected between the input of resistor R22 and the output of resistor R23. Further, it includes capacitor C23 connected between the input of resistor R23 and the output of resistor R24, and C24 connected between the input of resistor R24 and the output of resistor R21. And, the relationship between frequencies f1~f4 and f1', f2' at which the phase rotation of the first RC phase shifter to the fourth RC phase shifter of the polyphase filter becomes 90-deg is shown in FIG. 5. Here, the frequencies with respect to the first attenuation band are f1~f4, and the level relationship between the frequencies is as shown in (Formula 1).

$$|f1|>|f2|>|f3|>|f4| \quad \text{[Formula 1]}$$

Also, the frequencies with respect to the second attenuation band being narrower in bandwidth are f1', f2', f3~f4, and the level relationship between the frequencies is as shown in (Formula 2).

$$[f1|>|f2'|>|f3|>|f4| \quad \text{[Formula 2]}$$

Thus, in the polyphase filter of filter circuit 20, the resistors of the RC phase shifter connected in series fashion are preferable to be larger at the output side than at the input side. Generally, the resistor of each of the first RC phase shifter to the fourth RC phase shifter generates thermal noise that is proportional to the size of the resistor. Therefore, in order to reduce the NF (noise figure) of the filter circuit with these resistors connected in cascade fashion, it is preferable to make the resistor at the input side smaller and the resistor at the output side larger. That is, the NF of filter circuit 20 can be reduced by making frequencies f1~f4 determined by RC product as shown in (Formula 1), and frequencies f1', f2', f3, f4 as shown in (Formula 2). As a result, it is possible to improve the reception quality of receiving device 14.

Also, the first attenuation band and the second attenuation band are allowable to be partially or completely overlapping each other. Even in this case, receiving device 14 may bring about similar effects.

Further, it is desirable to control the frequency of local signal of local signal oscillator 19 and the sampling frequency of sampling signal oscillator 24 in accordance with the channel information and segment information from the channel setter and also to control the attenuation band of filter circuit 20 so that the central frequency of the second attenuation band is lower than the central frequency of the first attenuation band. In this way, when receiving device 14 receives a signal in the second radio frequency band, the sampling at AD converter 22 can be decreased and it is possible to suppress the consumed current of AD converter 22.

Furthermore, as in the present preferred embodiment, it is desirable to control the frequency of local signal of local signal oscillator 19 and the sampling frequency of sampling signal oscillator 24 in accordance with the channel information and segment information from the channel setter and also to control the attenuation band of filter circuit 20 so that the upper end of the first attenuation band becomes equal to the upper end of the second attenuation band. In this way, when receiving device 14 receives a signal in the second radio frequency band, the sampling at AD converter 22 can be further decreased and it is possible to further suppress the consumed current of AD converter 22.

A part or the whole of the first radio frequency band is allowable to correspond to the second radio frequency band. Thus, for example, even in case one segment is received at least out of 3-segment broadcasts such as ISDB-T (Integrated Services Digital Broadcasting for Terrestrial) system and ISDB-Tsb (Integrated Services Digital Broadcasting-Terrestrial for Sound Broadcasting) for ground wave digital broadcast, receiving device 14 will bring about same effects as described above.

Also, a specific example that is different from the one mentioned above is described in the following. Table 1 shows the bandwidth and modulation system in each ground wave digital broadcasting system, and carrier to noise ratio (carrier to noise ratio CNR (Carrier Noise Ratio) that shows the signal quality necessary for modulation at demodulator 20, and hereafter, it refers to as required C/N).

TABLE 1

| System | Bandwidth [MHz] | Modulation system | Required C/N[dB] |
| --- | --- | --- | --- |
| ISDB - T full-segment | 6 | 64QAM, CR7/8 | 21-22 |
| DVB-T | 7 or 8 | 64QAM, CR3/4 | 19-20 |
| GB20600-2006 | 8 | 64QAM, CR4/5 | 20 |

As shown in (Table 1), in the case of ISDB-T full-segment system, coding rate (hereafter, refers to as CR (code rate)) 7/8 of 64QAM (Quadrature Amplitude Modulation) is employed for the modulation system, and required C/N is 21~22 dB.

In the case of DVB-T (Digital Video Broadcasting-Terrestrial) system, CR3/4 of 64QAM is employed for the modulation system, and required C/N is 19~20 dB.

Also, in the case of GB20600-2006 (common name is DTTB, framing structure, channel coding and modulation for Digital Television Terrestrial Broadcasting system) that is same in channel bandwidth 8 MHz as the DVB-T system, CR4/5 of 64QAM is employed for the modulation system, and required C/N is about 20 dB.

In the present preferred embodiment, with the first attenuation bandwidth W1 being 8 MHz, and the second attenuation bandwidth W2 being 6 MHz that is narrower than the first attenuation bandwidth, when the signal in the second radio frequency band is inputted, the attenuation of input signal in the second attenuation band is more enhanced than the attenuation in the first attenuation band.

From Table 1, the first attenuation bandwidth W1 (=8 MHz) corresponds to the channel bandwidth of DVB-T system practically used in Europe for example. On the other hand, the second attenuation bandwidth W2 (=6 MHz) corresponds to the channel bandwidth of ISDB-T full-segment system practically used in Japan for example.

That is, as shown in Table 1, the amount of attenuation required is greater in ISDB-T full-segment than in DVB-T system, and therefore, setting the first attenuation bandwidth W1 and the second attenuation bandwidth W2 as mentioned above, it is possible to realize a small-sized receiving device capable of coping with a plurality of different systems.

Also, the first attenuation bandwidth W1 (=8 MHz) corresponds to the channel bandwidth of GB20600-2006 system practically used in China. Accordingly, even in such a case, it is possible to obtain same effects as in the above-mentioned DVB-T system.

As described above, respective systems are different in required C/N depending upon the modulation system, and the required C/N is greater in the case of ISDB-T full-segment system that is greater in CR and narrower in frequency bandwidth. This is because the amount of digital signal information transmitted is proportional to both of modulation factor and frequency bandwidth. Accordingly, in a common receiving environment, when the bandwidth is narrower, greater modulation factor (=larger C/N) is necessary for each system to broadcast nearly same amount of information (picture quality, sound quality, amount of data).

That is, in the case of receiving ISDB-T full-segment system, receiving device 14 is required to have more excellent receiving characteristic, and it is necessary to suppress the noise level input to demodulator 20 in various receiving environments. Accordingly, in the present preferred embodiment, for example, in a receiving environment where there exist a desired signal in the second radio frequency band and an adjacent image interfering signal, when the attenuation of the second attenuation band is more enhanced, it further becomes possible to suppress the image interference. As a result, a receiving device having excellent interfering resistance (receiving quality is hardly deteriorated even with intensive interfering signal inputted) can be realized.

Industrial Applicability

The receiving device of the present invention can be reduced in size, and for example, it can be used in electronic equipment such as a portable terminal and the like.

The invention claimed is:

1. A receiving device having an image rejection mixer which comprises an input terminal to which a signal in a first radio frequency band or a signal in a second radio frequency band narrower than the first radio frequency band is inputted, a first mixer and a second mixer connected in parallel fashion to the input terminal, a local signal oscillator for oscillating local signals having a phase difference from each other and being applied to the first mixer and the second mixer, and a filter circuit for combining a signal from the first mixer with a signal from the second mixer by rotating at least one of a phase of the signal from the first mixer and a phase of the signal from the second mixer, wherein when a signal in the first radio frequency band is inputted to the input terminal, the first mixer and the second mixer convert the input signal in the first radio frequency band to a signal in a first intermediate frequency band by using a first local signal from the local signal oscillator, while the filter circuit attenuates an image interfering signal existing in the first intermediate frequency band by means of a first attenuation band, and also, when a signal in the second radio frequency band is inputted to the input terminal, the first mixer and the second mixer convert the input signal in the second radio frequency band to a signal in a second intermediate frequency band by using a second local signal from the local signal oscillator, and the filter circuit attenuates an image interfering signal existing in the second intermediate frequency band by means of a second attenuation band that is narrower than the first attenuation band, wherein the amount of attenuation in the second attenuation band is greater than the amount of attenuation in the first attenuation band.

2. The receiving device of claim 1, wherein the filter circuit is a polyphase filter with a plurality of RC phase shifters formed of resistors and capacitors which are connected in series fashion, and also, out of the RC phase shifters connected in series fashion, the RC product of resistor and capacitor in one set of RC phase shifter is increased, thereby making the second attenuation band narrower than the first attenuation band.

3. The receiving device of claim 1, wherein the filter circuit is a polyphase filter with at least three sets of RC phase shifters formed of resistors and capacitors which are connected in series fashion, and also, out of the RC phase shifters connected in series fashion, the RC product of resistor and capacitor in at least two sets of RC phase shifter is increased, thereby making the second attenuation band narrower than the first attenuation band.

4. The receiving device of claim 1, wherein resistors of the RC phase shifter in the polyphase filter are larger at the output side than at the input side.

5. The receiving device of claim 1, wherein a part or the whole of the first attenuation band overlaps a part or the whole of the second attenuation band.

6. The receiving device of claim 1, wherein the first attenuation band includes the second attenuation band.

7. The receiving device of claim 1, wherein the central frequency in the second attenuation band is lower than the central frequency in the first attenuation band.

8. The receiving device of claim 1, wherein the upper end of the second attenuation band is equal to the upper end of the first attenuation band.

9. The receiving device of claim 1, wherein a part or the whole of the first radio frequency band corresponds to the second radio frequency band.

10. The receiving device of claim 1, wherein the phases of the local signals oscillated to the first mixer and the second mixer are perpendicular to each other.

11. The receiving device of claim 1, wherein the carrier to noise ratio with respect to a signal in the first radio frequency band is larger than the carrier to noise ratio with respect to a signal in the second radio frequency band.

12. The receiving device of claim 1, wherein the first attenuation bandwidth is a channel bandwidth of DVB-T system, and the second attenuation bandwidth is a channel bandwidth of ISDB-T system.

13. Electronic equipment comprising a receiving device mentioned in claim 1, a signal processor connected to the output side of the receiving device, and a display section connected to the output side of the signal processor.

* * * * *